United States Patent
Huang et al.

[19]

[11] Patent Number: 6,041,419
[45] Date of Patent: Mar. 21, 2000

[54] PROGRAMMABLE DELAY TIMING CALIBRATOR FOR HIGH SPEED DATA INTERFACE

[75] Inventors: Chi-Jung Huang, Saratoga; Ken Ming Li, Santa Clara, both of Calif.

[73] Assignee: S3 Incorporated, Santa Clara, Calif.

[21] Appl. No.: 09/085,984

[22] Filed: May 27, 1998

[51] Int. Cl.[7] .................................................. G06F 1/12
[52] U.S. Cl. .......................................... 713/401; 713/503
[58] Field of Search .................................. 713/400, 401, 713/503, 600

[56] References Cited

U.S. PATENT DOCUMENTS

| | | | |
|---|---|---|---|
| 5,020,038 | 5/1991 | Swapp et al. | 368/120 |
| 5,045,811 | 9/1991 | Lewis | 331/1 A |
| 5,376,849 | 12/1994 | Dickol et al. | 327/278 |
| 5,523,792 | 6/1996 | Ciardi et al. | 348/505 |
| 5,692,165 | 11/1997 | Jeddeloh et al. | 713/400 |

*Primary Examiner*—Dennis M. Butler
*Attorney, Agent, or Firm*—Fenwick & West LLP

[57] ABSTRACT

A graphics processing system incorporates a calibrator module into the system. As a memory module continuously transmits a model data signal, the calibrator module automatically increments the number of stages of delay, which are integrated into a delayed clock signal. Each delayed clock signal triggers the sampling of the model data signal by a plurality of latches. The calibrator module compares each of these sampled data signals with the original model data signals. If the delayed clock signal is properly aligned with the model data signal to cause the two signals to match, the calibrator module stores a result signal in a "1" logic state. If the delayed clock signal is misaligned with the model data signal, the calibrator module will store the result signal in a "0" logic state. When all of the possible stages of delay have been activated by the calibrator module and the corresponding sampled data signals analyzed, a processor module determines the optimum number of stages of delay needed for proper alignment of the delayed clock signal with the transmitted model data signal

19 Claims, 6 Drawing Sheets

PROGRAMMABLE DELAY TIMING CALIBRATOR FOR HIGH SPEED DATA INTERFACE

BACKGROUND OF INVENTION

1. Field of the Invention

The present invention relates to graphics processing systems. In particular, the present invention relates to the alignment of data signals with clock signals in a high speed graphics processing system.

2. Description of Related Art

A conventional graphics processing system includes a memory module, a memory interface unit (MIU) and a graphics controller. The memory module serves as a frame buffer for storing graphical data, which is displayed as a visual image on a monitor. The graphics controller updates this visual image by updating the graphics data stored within the memory module. The MIU is an interface, which controls the data transfer of the graphics data between the memory module and the graphics controller.

When the graphics controller is ready to manipulate the graphics data from the memory module, the MIU issues a read command signal for the memory module. The memory module responds to this command signal by transmitting the stored graphics data as a data signal to the graphics controller. When the graphics controller has completed manipulating this transmitted graphics data, the MIU issues a write command signal to the memory module for the memory module to receive a modified data signal, which replaces the original graphics data with the manipulated graphics data contained within the modified data signal. In an ideal system, each command signal and the corresponding response by the memory module occur within consecutive MIU clock (MCLK) cycles. Unfortunately, due to delays inherent within the system, misalignment within the graphics controller module between the MCLK signal and the data signals usually occurs.

To attempt to address this misalignment problem, recent graphics processing systems compensate for the inherent delay in the system by injecting the same latency, which exists in the data signal, into the MCLK signal. In particular, this conventional system relies upon modifying the MCLK signal, which is received by the graphics controller, by routing the MCLK signal through the memory module prior to being received by the graphics controller.

This reliance upon the returned MCLK signal, however, does not ensure a proper setup and hold time for the graphics controller to properly receive the data signal from the memory module. To more accurately align the setup and hold times of the MCLK signal with the data signal, conventional graphics processing systems utilize a programmable delay module in conjunction with a plurality of latches to inject an additional delay into the MCLK signal. In particular, by activating a number of stages of delay within the programmable delay module, the programmable delay module transforms the MCLK signal into a delayed MCLK (DCLK) signal. The plurality of latches, which are coupled to the programmable delay module, respond to receiving the DCLK signal by latching (sampling) the data signal, which is transmitted by the memory module. The graphics controller then retrieves this sampled data signal from the plurality of latches and manipulates the signal accordingly. When the DCLK signal contains a proper setup and hold time, the sampled data signal will match the transmitted data signal. However, if the stages of delay fail to adequately align the DCLK signal with the transmitted data signal, the sampled data signal will not match the transmitted data signal, thereby causing data corruption problems.

To determine the optimum number of stages of delay, which are needed for the programmable delay module to establish the necessary setup and hold times for the DCLK signal, manual trial and error is performed. Since manufacturing process variations between each component within the graphics processing system causes slightly different latency characteristics, this manual trial and error analysis must be repeated for each alternative component which is used in the system.

What is needed is a more efficient system and method for calibrating the graphics processing system with any circuit design through the automatic identification of the optimum number of stages of delay, which are needed to properly align the DCLK signal with the transmitted data signals.

SUMMARY OF THE INVENTION

The present invention overcomes the deficiencies of the conventional graphics processing system by integrating a calibrator module into the graphics processing system. In particular, as a memory module continuously transmits a model data signal, the calibrator module automatically increments the number of stages of delay in order to assist in the determination of the optimum value needed for proper alignment between the data signal and a delayed clock signal.

The calibrator module, which is coupled to a plurality of latches and a programmable delay module, includes a calibrator controller module, a result comparator module and a result logger module. The calibrator controller module, which is coupled to the programmable delay module, incrementally increases the number of stages of delay, which are activated within the programmable delay module. For each number of active stages of delay, the programmable delay module generates a delayed clock signal. The plurality of latches respond to each delayed clock signal by sampling the transmitted model data signal with corresponding new setup and hold times.

The result comparator module, which is coupled to the plurality of latches, compares each sampled data signal with the originally transmitted model data signal. If the delayed clock signal is properly aligned with the model data signal to cause the two data signals to match, the result comparator module transmits a result signal in a "1" logic state to the result logger module. If the delayed clock signal is misaligned with the model data signal, the result comparator module transmits a result signal in the "0" logic state to the result logger module.

The result logger module stores each of these result signals and their association with a specific number of stages of delay. When all of the possible stages of delay have been applied to the delayed clock signal by the calibrator controller module and the corresponding sampled data signals have been analyzed by the result comparator module, a processor module retrieves the result signals from the result logger module and determines the optimum number of stages of delay needed for proper alignment of the delayed clock signal with the received model data signal.

DETAILED DESCRIPTION OF THE PREFERRED EMBODIMENTS

A preferred embodiment of the present invention is now described with reference to figures where like reference numbers indicate identical or functionally similar elements. In addition, the left most digit of each reference number corresponds to the figure in which the reference number is first used.

Figure 1:
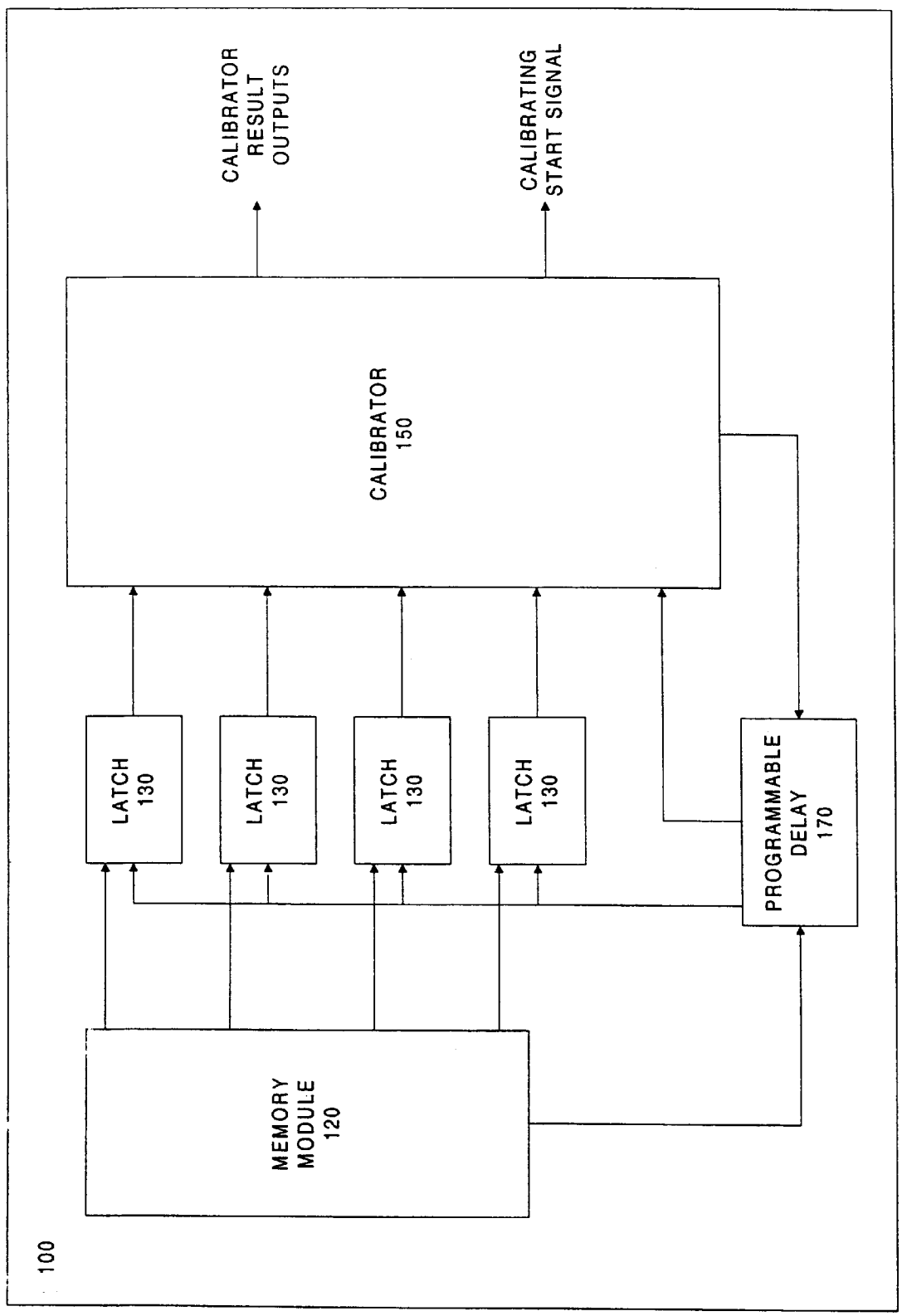
FIG. 1 is an illustration of an overview block diagram of a preferred embodiment implemented within a graphics processing system.

FIG. 1 illustrates an overview of a graphics processing system 100 representing a preferred embodiment of the present invention. The system 100 includes a memory module 120, a plurality of latches 130, a programmable delay 170 and a calibrator module 150. At initialization, the memory module 120 is loaded with two complimentary model data sequences, which for illustrative purposes will be presumed to be "0101" and "1010". In a preferred embodiment, the model data signals can be as large as 64 bits in length.

Upon the memory module 120 receiving a transmit command signal from a memory interface unit (MIU) (not specifically illustrated), which is attached to both the calibrator module 150 and the memory module 120, the memory module 120 begins to continuously alternate the transmission of the two model data sequences. In a preferred embodiment, such transfers correspond to a system operating frequency of approximately 100 Mhz or higher.

The programmable delay module 170, which is coupled to the memory module 120, receives the MIU clock (MCLK) signal. Based upon the number of activated stages of delay activated within the programmable delay module 170, the MCLK signal is retransmitted as one of a variety of delayed MCLK (DCLK) signals. In a preferred embodiment, the programmable delay module 170 includes 8 delay stages with each stage representing a unit delay.

The plurality of latches 130 are coupled to the programmable delay 170 and the memory module 120. Upon receipt of each DCLK signal, the plurality of latches 130 sample the first and second model data signals transmitted by the memory module 120 and retransmit these sampled data signals to the calibrator module 150. The calibrator module 150 analyzes these sampled data signals by comparing each sampled data signal with the originally transmitted model data signal (0101 or 1010) that corresponds to the sampled data signal. Even though FIG. 1 only includes four latches 130 for illustrative purposes, which enables the system 100 to only process 4-bit data signals, in a preferred embodiment, the system 100 includes as many as 64 latches for processing 64-bit data signals.

The calibrator module 150, which is coupled to the plurality of latches 130 and the programmable delay module 170, attempts to align the setup and hold times of the DCLK signal with the transmitted model data signals by incrementally increasing the number of stages of delay from 1 to approximately 8 stages. After each new set of stages of delay is activated, the calibrator module 150 analyzes the alignment of the DCLK signals with the model data signals by comparing the sampled data signals with the model data signals. If the two data signals match, the calibrator module 150 records the number of stages of delay as a possible optimal setting for the programmable delay module 170. If the two signals fail to match, the calibrator module 150 records the number of stages of delay as corrupting the sampling of the transmitted model data signal. Once the results of all of the stages of delay have been recorded, a processor module (not shown) retrieves the data from the calibrator module 150 and determines the optimal number of activated stages of delay needed within programmable delay module 170 to ensure proper setup and hold times for sampling the data signals.

Figure 2:
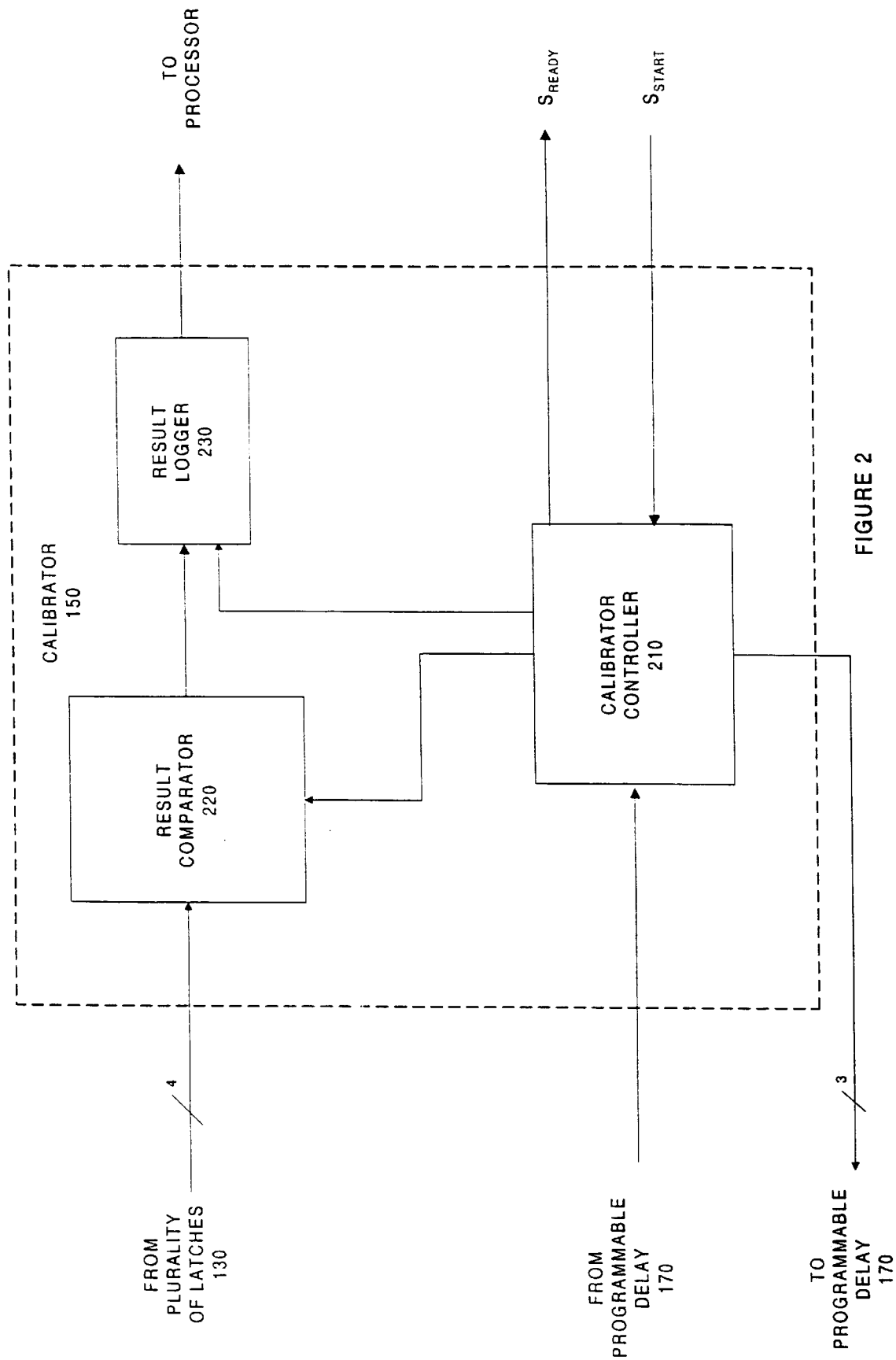
FIG. 2 illustrates a detailed block diagram of the calibrator module of a preferred embodiment.
Figure 3:
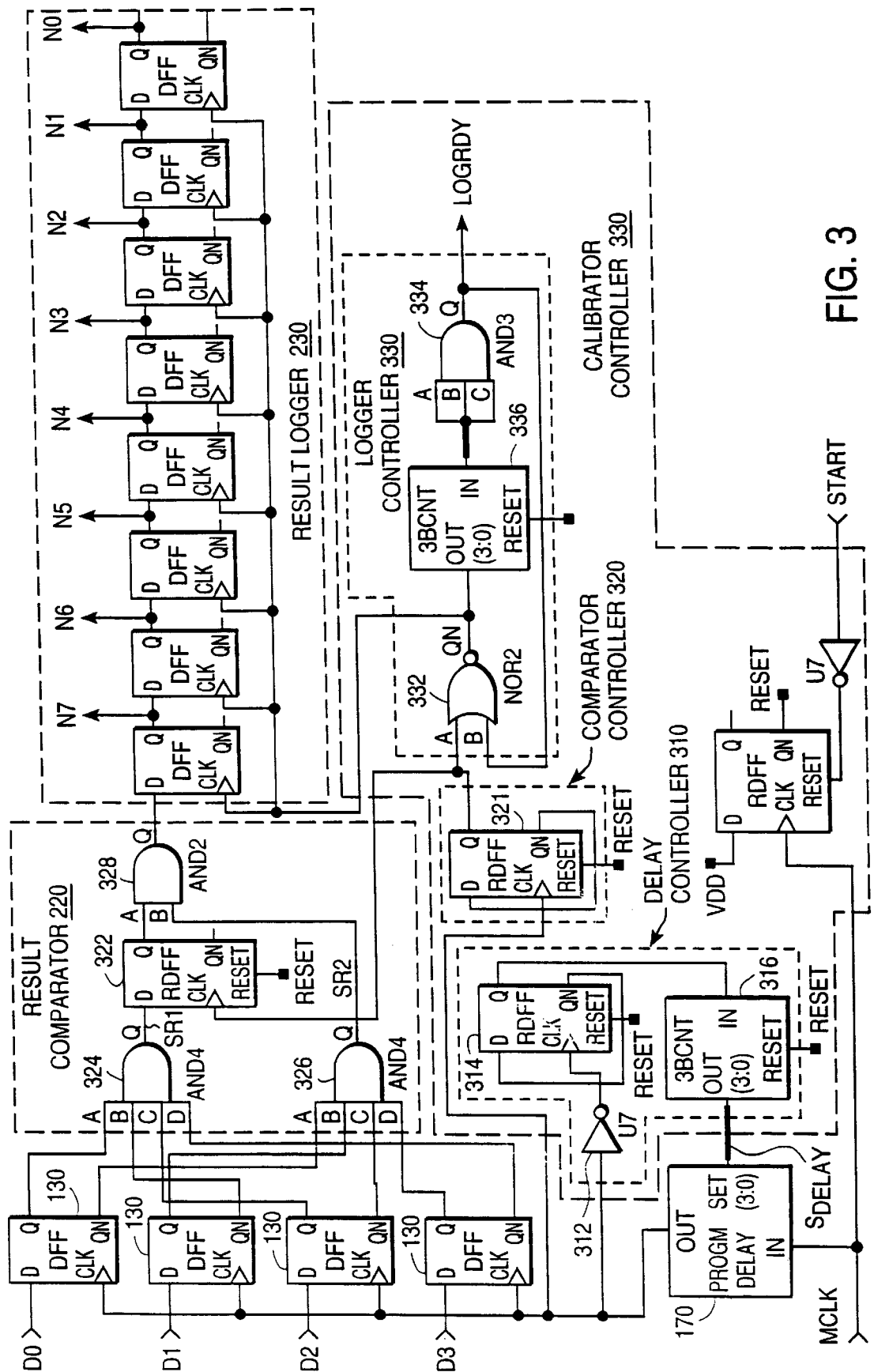
FIG. 3 illustrates a low level schematic of the calibrator module of a preferred embodiment.

FIG. 2 in conjunction with FIG. 3 illustrates a more detailed view of the calibrator module 150 of a preferred embodiment. The calibrator module 150 includes a calibrator controller module 210, a result comparator module 220 and a result logger module 230. The calibrator controller module 210, which is coupled to the programmable delay module 170, the result comparator module 220 and the result logger module 230, controls the calibration of the system 100 by transforming the DCLK signal into one of three clock signals, a delay counter clock (DCCLK) signal, a comparator clock (CCLK) signal or a logger clock (LCLK) signal.

The calibrator controller module 210 includes a delay controller module 310, a comparator controller module 320 and a logger controller module 330. In a preferred embodiment, the delay controller module 310 includes an inverter 312, a first D flip flop 314 and a counter 316. The inverter 312, which is coupled to the programmable delay module 170, inverts the DCLK signal. The first D flip flop 314, which is coupled to the inverter 312, doubles the inverted DCLK signal to generate the DCCLK signal. The first counter 316, which is coupled to the first flip flop 314, responds to each DCCLK signal pulse by incrementing its value by 1 and by transmitting to the programmable delay module 170 a delay control signal $S_{delay}$, which corresponds to the value of the first counter 316. When received by the programmable delay module 170, $S_{delay}$ causes the programmable delay module 170 to activate a number of stages of delay, which is equal to the value of $S_{delay}$. This incrementing of the number of stages of delay based upon the value of $S_{delay}$ continues until a maximum number of stages of delay, which in this embodiment is eight, is reached.

Figure 4:
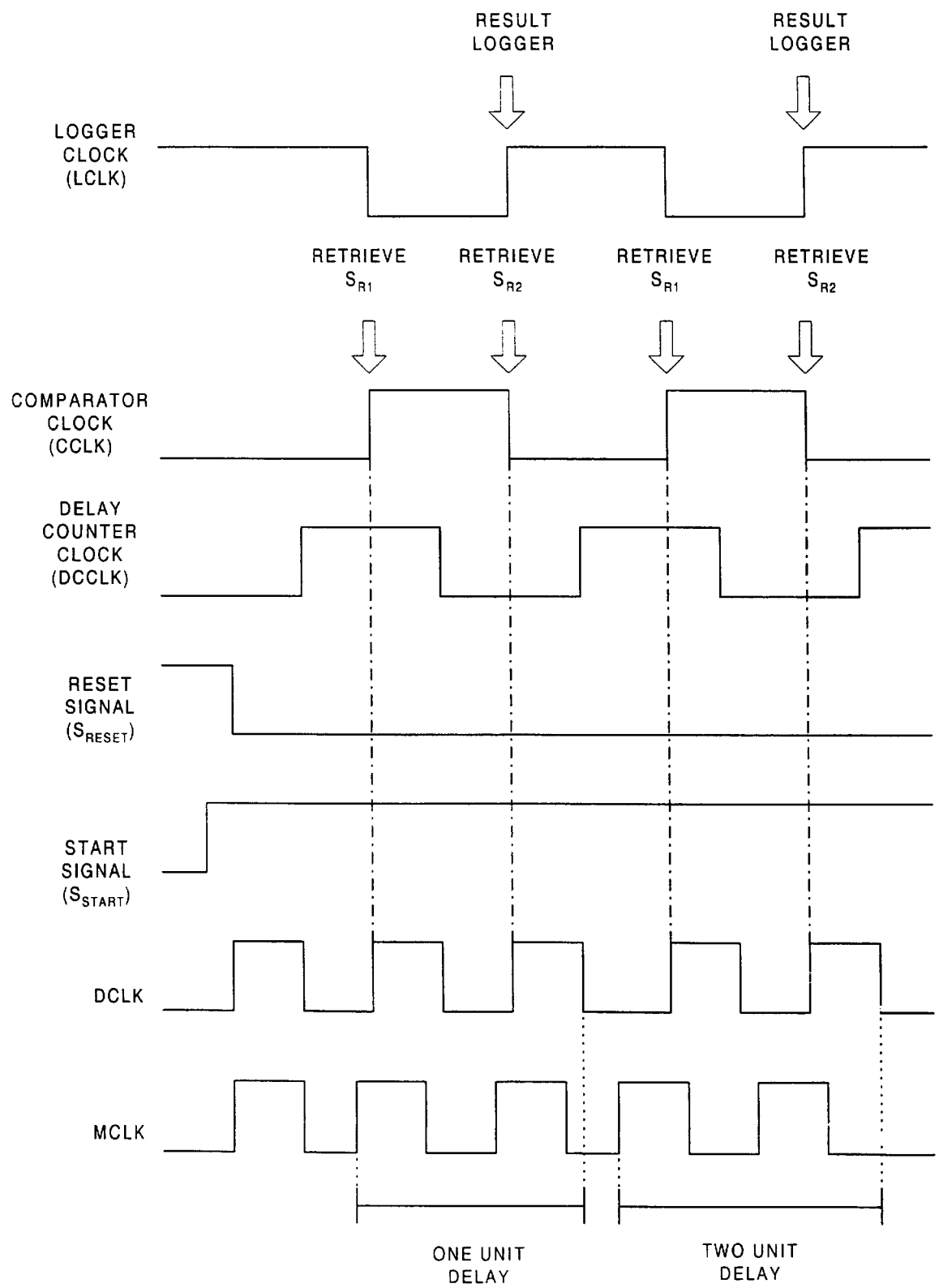
FIG. 4 illustrates a timing diagram of a preferred embodiment.

The comparator controller module 320, which is coupled to the result comparator module 220, generates the CCLK signal by doubling the DCLK signal. In a preferred embodiment, the comparator controller module 320 is a second D flip flop 321 and the result comparator module 220 includes three AND gates 324, 326, 328 and a third D flip flop 322. As illustrated in FIG. 3 in conjunction with FIG. 4, the third D flip flop 322 responds to the leading edge of the CCLK signal by temporarily storing the first data signal result $S_{R1}$, which is transmitted from the first AND gate 324, until the second sampled data signal $S_{R2}$ is available for processing. The first data signal result $S_{R1}$ represents the result of attempting to match the first sampled data signal with the first model data signal (0101). The second data signal result $S_{R2}$ represents the result of attempting to match the second sampled data signal with the second model data signals (1010).

Upon receiving the trailing edge of the CCLK signal, the third D flip flop 322 transmits $S_{R1}$ to the third AND gate 328. At approximately the same time, the third AND gate 328 also receives the second data signal result $S_{R2}$ from the second AND gate 326. If $S_{R1}$ and $S_{R2}$ are each in a '1' logic state, which represents the success of the matching of the first and second sampled data signals with the corresponding first and second model data signals, the third AND gate 328 transmits a result signal $S_{result}$ in a '1' logic state. If both data signal results are not in the '1' logic state, the third AND gate 328 transmits $S_{result}$ in a '0' logic state, which represents the failure of the first and the second sampled data signals to match the first and the second model data signals.

The logger controller module 330, which is coupled to the result logger module 230, manages the storing of the $S_{result}$ results in the result logger module 230 through the transmission of the LCLK signal, which is an inverted CCLK signal. In a preferred embodiment, the result logger module 230 is a plurality of shift registers. Upon receipt of each LCLK signal, the result logger module 230 serially stores the current $S_{result}$, which is transmitted by the third AND gate 328, in the first of the plurality of shift registers. Any previously stored $S_{result}$ data is shifted to the next shift register to the right.

The logger controller module 330 associates each of the plurality of shift registers with a specific number of stages of delay. When the stages of the delay reach the maximum value, which in this embodiment is eight, the logger controller module 330 transmits a logger ready signal $S_{logrdy}$ to the processor (not shown). The logger controller module 330 includes a second counter 336, a NOR gate 332 and a fourth AND gate 334. The NOR gate 332, which is coupled to the comparator controller module 320, receives both the CCLK signal and the output of the AND gate 334 and transmits the LCLK signal. Upon receipt of each pulse of the LCLK signal, the second counter 336, which is coupled to the NOR gate 332, increments its value by 1. The fourth AND gate 334, which is coupled to the second counter 336, receives the output of the value of the second counter 336, which in a preferred embodiment is 3 bits long with a maximum value of 8.

When the second counter 336 reaches the maximum value, which in this embodiment is eight, the fourth AND gate 334 transmits $S_{logrdy}$ to the result logger 230, which results in all of the data stored within the result logger module 230 to be retrieved by the processor module (not shown). To determine the optimum number of stages of delay, which will ensure a proper setup and hold time for the DCLK signal, the processor module processes all of the $S_{result}$ with a '1' logic state with a predefined algorithm. In a preferred embodiment, a first algorithm determines the optimum number of stages of delay by choosing the first number of stages of delays, which corresponds to a $S_{result}$ having a '1' logic state. In an alternative embodiment, a second algorithm determines the optimum number of stages of delay by choosing the number of stages of delay corresponding to a middle $S_{result}$ result of three consecutive $S_{result}$ results having '1' logic states.

Figure 5:
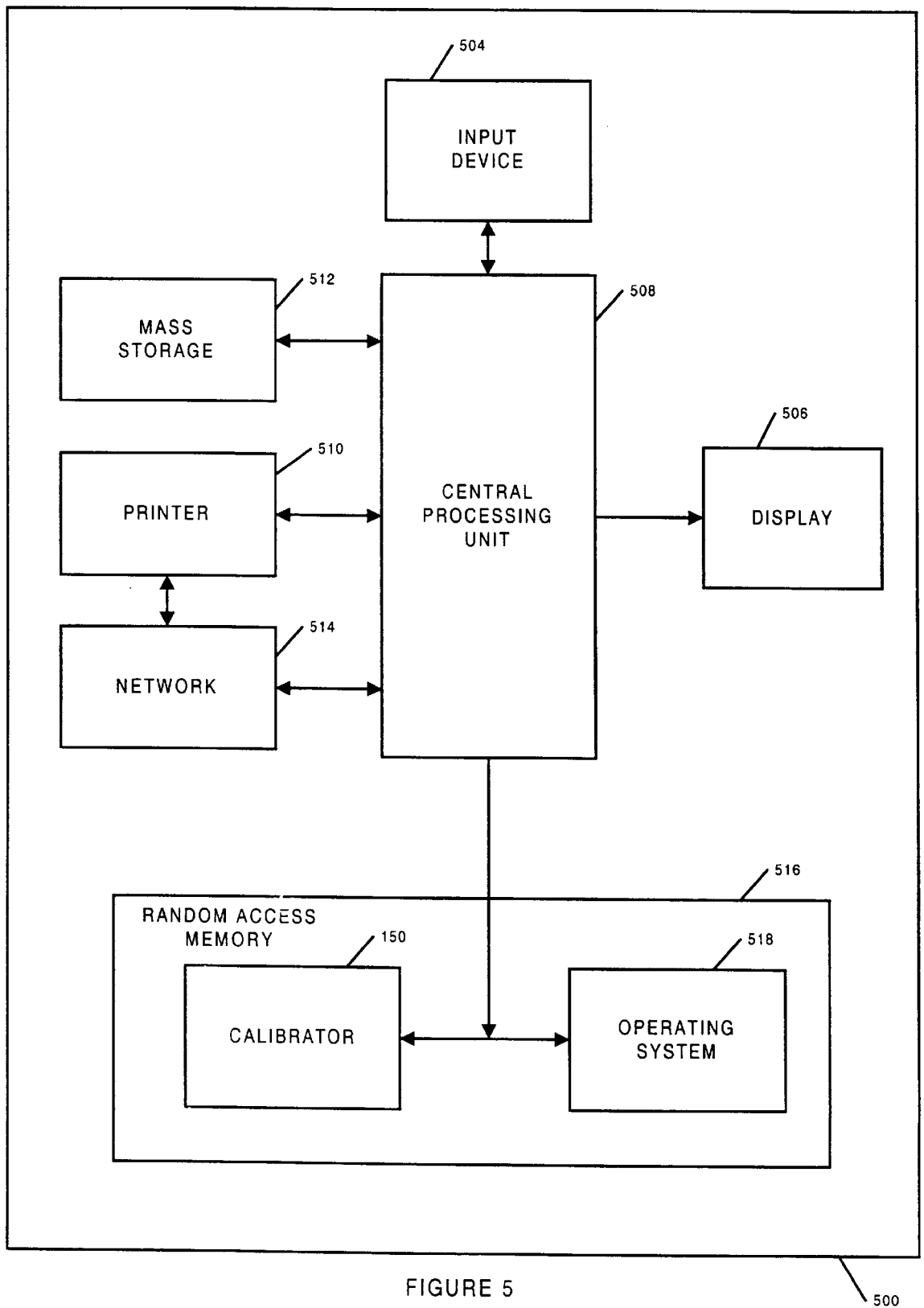
FIG. 5 is an illustration of a computer system in which an alternative embodiment operates.

FIG. 5 is an illustration of a computer system 500 according to an alternative embodiment. The computer system 500 includes an input device 504 coupled to a central processing unit (CPU) 508, the CPU 508 also is coupled to a display monitor 506, a printer 510, a mass storage device 512 and a random access memory (RAM) 516. During computer operation, the RAM 516 includes an operating system 518, e.g., Windows 95, and the calibrator module 150. In this embodiment, the calibrator module 150 is a software program. The input device 504, the CPU 508, display 506, printer 510, and mass storage 512 are all part of a conventional computer system, e.g., Pentium-based computer (commercially available from Intel, Corp., Santa Clara, Calif.). In some embodiments the computer system 500 is coupled to a network 514.

Figure 6:
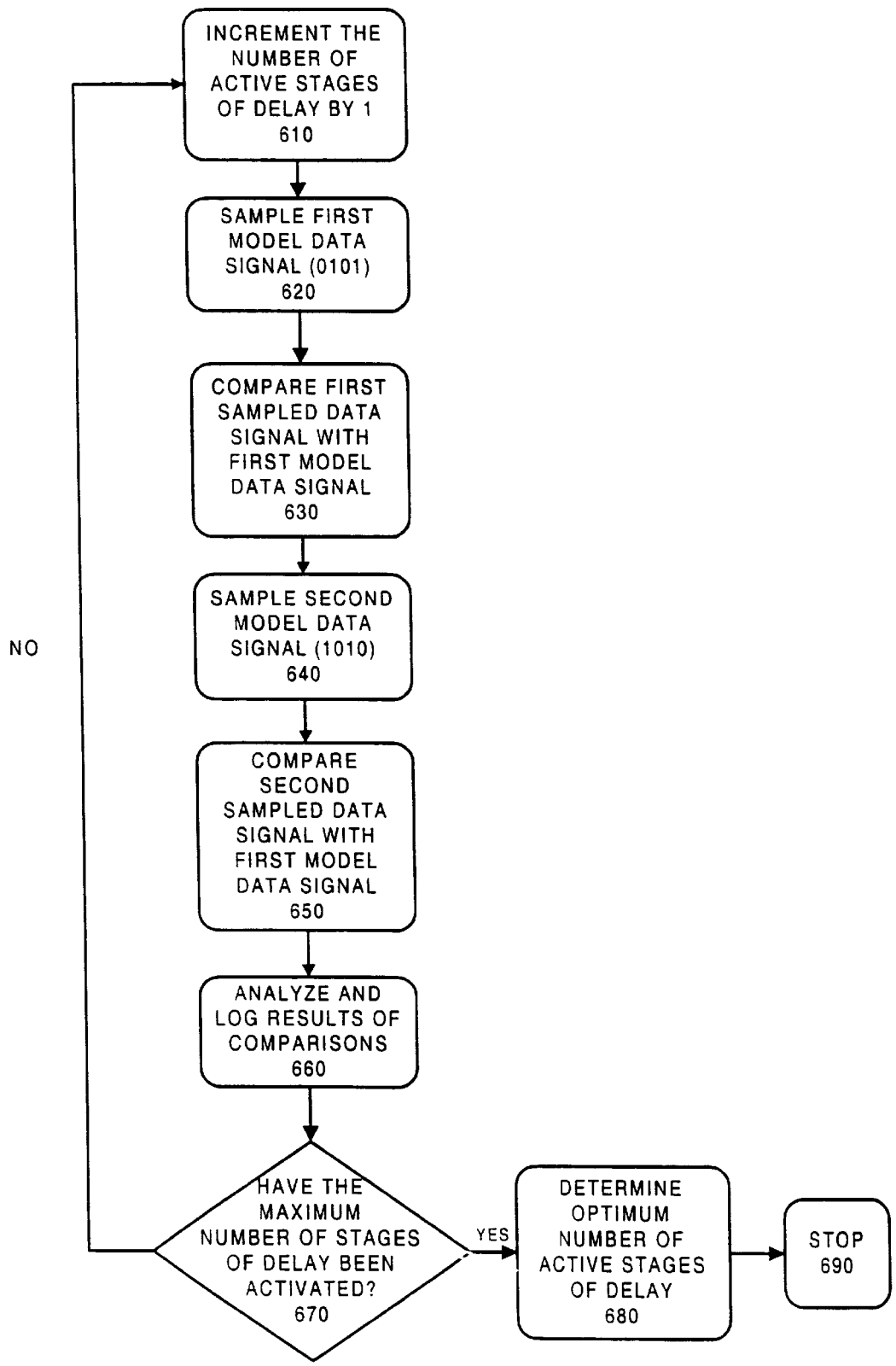
FIG. 6 illustrates a flow chart of a calibration method of a preferred embodiment.

FIG. 6 is a high level flowchart illustrating the operation of the calibrator module 150 of a preferred embodiment. After an initialization of the memory module 120, which loads and triggers the alternating transmission of a first model data signal (0101) and a second model data signal (1010), the number of active delays within the programmable delay module 170, which are integrated into the MCLK signal, are incremented at step 610 by a value of 1. The first model data signal (0101) is sampled at step 620. The resulting first sampled data signal is compared at step 630 to the first model data signal (0101). The second model data signal (1010) then is sampled at step 640. The resulting second sampled data signal is compared at step 650 to the second model data signal (1010). The results of the comparisons then are analyzed and logged at step 660 for later retrieval.

If the active number of stages of delay within the programmable delay 170 is not equal to the maximum number of possible active stages, steps 610 through 670 are repeated. If the active number of stages is equal to the maximum number of possible active stages, the logged results are processed and an optimum number of active stages of delay for the graphics processing system 100 is determined at step 680. In this embodiment, the determination at step 680 of the optimum number of active stages of delay can be calculated by utilizing one of the before mentioned algorithms.

Having described the present invention with reference to specific embodiments, the above description is intended to illustrate the operation of a preferred embodiments and is not meant to limit the scope of the invention. For example, the calibrator module 150 can be implemented solely as a software application. The scope of the invention, therefore, is to be limited only by the following claims. From the above discussion, many variations will be apparent to one skilled in the art that would yet be encompassed by the true spirit and scope of the present invention.

What is claimed is:

1. A calibration system comprising:
    a programmable delay module including a plurality of stages of delay for receiving a first signal and for transmitting a second signal, said second signal corresponding to the first signal delayed by a delay value indicative of at least one of the plurality of stages of delay;
    a latch that responds to the receipt of the second signal by sampling a third signal and transmitting a fourth signal; and
    a result comparator, coupled to the latch, for comparing the third signal to the fourth signal, for responding to the fourth signal matching the third signal by transmitting a fifth signal having a first logic state and for responding to the fourth signal not matching the third signal by transmitting a fifth signal having a second logic state.

2. The calibration system of claim 1 further comprising:
    a result logger module coupled to the result comparator module for storing the fifth signal.

3. The calibration system of claim 2, wherein the result logger module is a plurality of shift registers.

4. The calibration system of claim 1, further comprising:
    a logger controller module coupled to a result logger module for associating the fifth signal with the delay value.

5. The calibration system of claim 1 further comprising a delay controller module coupled to the programmable delay module for automatically varying the number of the plurality of stages of delay within the programmable delay module.

6. The calibration system of claim 2 further comprising a delay controller module coupled to the programmable delay module for automatically varying the number of the plurality of stages of delay within the programmable delay module.

7. The calibration system of claim 4 further comprising a delay controller module coupled to the programmable delay module for automatically varying the number of the plurality of stages of delay within the programmable delay module.

8. A calibration method relying upon a programmable delay including a plurality of stages of delay, wherein said method comprises the steps of:

receiving a first signal and transmitting a second signal, said second signal corresponding to the first signal delayed by a delay value indicative of at least one of the plurality of stages of delay;

responding to receipt of the second signal by sampling a third signal and transmitting a fourth signal;

comparing the third signal to the fourth signal;

responding to the fourth signal matching the third signal by transmitting a fifth signal having a first logic state; and responding to the fourth signal not matching the third signal by transmitting a fifth signal having a second logic state.

9. The method of claim 8 further comprising the step of storing the fifth signal.

10. The method of claim 9 wherein storing the fifth signal further comprises the step of shifting the storage of the fifth signal from a first shift register to a second shift register.

11. The method of claim 8 further comprising the step of associating the fifth signal with the delay value.

12. The method of claim 8 further comprising the step of automatically varying a delay value indicative of at least one of the plurality of stages of delay within the programmable delay module.

13. The method of claim 8 further comprising the step of determining an optimum value for the delay value.

14. The method of claim 9 further comprising the step of automatically varying a delay value indicative of at least one of the plurality of stages of delay within the programmable delay module.

15. The method of claim 11 further comprising the step of automatically varying a delay value indicative of at least one of the plurality of stages of delay within the programmable delay module.

16. A program storage device readable by a machine, tangibly embodying a program of instructions executable by a processor to perform method steps for calibrating a system, said method steps comprising:

receiving a first signal and transmitting a second signal, said second signal corresponding to the first signal delayed by a delay value indicative of at least one of the plurality of stages of delay;

responding to receipt of the second signal by sampling a third signal and transmitting a fourth signal;

comparing the third signal to the fourth signal;

responding to the fourth signal matching the third signal by transmitting a fifth signal having a first logic state; and responding to the fourth signal not matching the third signal by transmitting a fifth signal having a second logic state.

17. The program storage device readable by a machine of claim 16, wherein said method steps further comprises associating the fifth signal with the delay value.

18. The program storage device readable by a machine of claim 16, wherein said method steps further comprises automatically varying a delay value indicative of at least one of the plurality of stages of delay within the programmable delay module.

19. The program storage device readable by a machine of claim 16, wherein said method steps further comprises determining an optimum value for the delay value.

* * * * *